United States Patent
Dobashi

(10) Patent No.: US 12,203,160 B2
(45) Date of Patent: Jan. 21, 2025

(54) SURFACE-COATED CUTTING TOOL

(71) Applicant: MITSUBISHI MATERIALS CORPORATION, Tokyo (JP)

(72) Inventor: Masataka Dobashi, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 464 days.

(21) Appl. No.: 17/770,726

(22) PCT Filed: Oct. 20, 2020

(86) PCT No.: PCT/JP2020/039466
§ 371 (c)(1),
(2) Date: Apr. 21, 2022

(87) PCT Pub. No.: WO2021/085253
PCT Pub. Date: May 6, 2021

(65) Prior Publication Data
US 2022/0371099 A1    Nov. 24, 2022

(30) Foreign Application Priority Data
Oct. 29, 2019   (JP) ................ 2019-195796

(51) Int. Cl.
*B23B 27/14*  (2006.01)
*C23C 14/06*  (2006.01)
(Continued)

(52) U.S. Cl.
CPC ........ *C23C 14/0617* (2013.01); *C23C 14/325* (2013.01); *C23C 28/044* (2013.01)

(58) Field of Classification Search
None
See application file for complete search history.

(56) References Cited

U.S. PATENT DOCUMENTS

| 5,318,840 A | 6/1994 | Ikeda et al. |
| 5,882,777 A | 3/1999 | Kukino et al. |

(Continued)

FOREIGN PATENT DOCUMENTS

| EP | 709483 A2 * | 5/1996 | ............. C23C 14/02 |
| JP | H04-26756 A | 1/1992 | |

(Continued)

OTHER PUBLICATIONS

Supplementary European Search Report dated Mar. 30, 2023, issued for European Patent Application No. 20881190.1.

*Primary Examiner* — David Sample
(74) *Attorney, Agent, or Firm* — Locke Lord LLP

(57) ABSTRACT

A surface-coated cutting tool comprises a tool substrate comprising a cBN sinter and a hard coating layer including a lower sublayer α and an upper sublayer β on the surface of the cutting edge; wherein α satisfies $(Al_{1-x}Ti_x)N$ (0.40≤x≤0.60); β satisfies $(Al_{1-y-z}Ti_yB_z)N$ (0.40≤y≤0.60 and 0.01≤z≤0.10); in the sublayer β, the variation in the concentration of the B component is repeated; the average Bmaxav of the maxima in the concentration of the B component satisfies z<Bmaxav≤2.0×z, and the average Bminav of the minima in the concentration of the B component satisfies 0≤Bminav<z; and the average thickness tα of α and the average thickness tβ of β satisfy expression: 2.0≤tβ/tα≤6.0; and the residual stress σ of the overall hard coating layer satisfies −2.0 GPa≤σ≤−0.5 GPa.

4 Claims, 3 Drawing Sheets

(51) Int. Cl.
*C23C 14/32* (2006.01)
*C23C 28/04* (2006.01)

(56) References Cited

U.S. PATENT DOCUMENTS 12,059,731 B1 * 8/2024 Suzuki .................... C23C 28/42
2017/0298505 A1 * 10/2017 Tatsuoka ................. C23C 16/34

FOREIGN PATENT DOCUMENTS

| | | |
|---|---|---|
| JP | H08-104583 A | 4/1996 |
| JP | 3416938 B2 | 6/2003 |
| JP | 2006-082209 A | 3/2006 |
| JP | 2006-334739 A | 12/2006 |
| JP | 2007-30130 A | 2/2007 |
| JP | 2015-178171 A | 10/2015 |

* cited by examiner

Height in upper sublayer β

SURFACE-COATED CUTTING TOOL

TECHNICAL FIELD

The present invention relates to a surface-coated cutting tool (hereinafter, also referred to as "coated tool"). This patent application claims the benefits of Japanese Patent Application No. 2019-195796, filed on Oct. 29, 2019, the entire contents of which are hereby expressly incorporated by reference.

BACKGROUND ART

Coated tools are categorized into removable inserts, which are attached to tips of turning tools for turning and flattening of various types of steel, cast iron, and other materials; drills and miniature drills, which are used for drilling and cutting of workpieces; and solid-type end mills, which are used for face, groove, and shoulder machining of workpieces. Also known are insert-type end mills to which removable inserts are attached for performing cutting operations in the same way as solid-type end mills. WC-based cemented carbide, TiCN-based cermet, cubic boron nitride based sinters, high-speed tool steels, and other materials have been used as substrates of coated tools.

In the past, various proposals have been made to improve the performance of coated tools.

For example, PTL 1 proposes deposition of boronitride having a composition represented by $(Al_xTi_{1-x})(B_yN_{1-y})$ (where, $0.05 \leq x \leq 0.75$, $0.02 \leq y \leq 0.12$) on a cemented carbide tool substrate to form a hard coating layer for improving the wear resistance of coated tools.

PTL 2 discloses a surface-coated cutting tool consisting of an upper layer and a lower layer each composed of a composite nitride of Ti, Al, and B formed on the surface of a tool substrate made of WC-based cemented carbide, TiCN-based cermet, or high-speed tool steel, where the upper layer has an alternating stacked structure of thin layers A and thin layers B where the thin layers are composite nitride layers of Ti, Al, and B satisfying the formula: $[Ti_{1-(M+N)}Al_MB_N]N$ (where M is 0.15 to 0.35 and N is 0.15 to 0.30 in atomic proportion), the thin layers B are composite nitride layers of Ti, Al, and B satisfying the formula: $[Ti_{1-(X+Y)}Al_XB_Y]N$ (where X is 0.5 to 0.60, Y is 0.01 to 0.10 in atomic proportion); the lower layer has a single-phase structure of Ti, Al, and B satisfying the formula: $[Ti_{1-(X+Y)}Al_XB_Y]N$ (where X is 0.5 to 0.60, Y is 0.01 to 0.10 in atomic proportion); and the hard coating layer of the surface-coated cutting tool exhibits excellent wear resistance in high-speed cutting of heat-resistant alloys.

The surface-coated cutting tools proposed in Patent Documents 1 and 2 above each has a hard coating layer formed on the surface of cemented carbide. A surface-coated cutting tool with a hard coating layer deposited on sintered cBN as a tool substrate is also proposed, for example, in PTL 3.

PTL 3 discloses a surface-coated cutting tool with a hard coating layer consisting of a lower sublayer A directly above a cBN sintered body and an upper sublayer B formed on the lower sublayer, where the lower sublayer A has a composition represented by the formula: $Ti_{1-a}Al_aN$ (where the subscript a satisfies $0.3 \leq a \leq 0.7$); the upper sublayer B has a composition represented by the formula: $Ti_{1-x-y}Al_xSi_yN$ (where subscripts x and y satisfy $0.3 \leq x \leq 0.7$ and $0.01 \leq y \leq 0.1$ in atomic proportion) and the residual stress σA (GPa) of the lower sublayer A on the clearance surface and the residual stress σT (GPa) of the overall hard coating layer satisfy the expressions: σA<σT, $-7.0 \leq \sigma A \leq -1.0$, $-4.0 \leq \sigma T \leq -0.5$, and $|\sigma A - \sigma T| < 4.0$.

CITATION LIST

Patent Literatures

[PTL 1] JP-A-Hei4-26756
[PTL 2] JP-A-2006-334739
[PTL 3] JP-A-2015-178171

SUMMARY OF INVENTION

Problems to be Solved

The inventor has reviewed the coated tools described in PTL 1 to 3 above, and has reached the following views:

Although the coated tool described in PTL 1 exhibits excellent wear resistance against continuous cutting of carbon steel, it has insufficient chipping resistance nor wear resistance when used in intermittent cutting of high-hardness steel.

Although the coated tool described in PTL 2 exhibits excellent wear resistance when used in high-speed cutting involving high heat generation of heat-resistant alloys, such as Ni alloys, Co alloys, and even Ti alloys, it has insufficient chipping resistance when used in intermittent cutting of high-hardness steel.

Although the coated tool described in PTL 3 exhibits excellent chipping and wear resistance in high-speed continuous cutting of high-hardness steel as described in that document, it is not still satisfactory when used in intermittent cutting.

In conclusion, the coated tools described in PTLs 1 to 3 cannot satisfy the compatibility between a reduction in the occurrence of chipping and excellent wear resistance in the intermittent cutting of high-hardness steel, resulting in short service lives of tools.

The term "high-speed steel" throughout the specification refers to an alloy steel that has been carburized and quenched and has a surface hardness HRC of 35 to 65.

The term "intermittent cutting" refers to machining causing idling occurs at the cutting edge during cutting, and can be exemplified by cutting of work materials with one or more slits.

Means for Solving Problems

A surface-coated cutting tool according to an embodiment of the present invention comprises a tool substrate comprising a cubic boron nitride sinter and having a cutting edge, and a hard coating layer on at least the surface of the cutting edge; wherein (a) the hard coating layer includes a lower sublayer α directly on the tool substrate and an upper sublayer β on the lower sublayer α;

(b) the lower sublayer α has an average composition of $(Al_{1-x}Ti_x)N$ (where x satisfies expression: $0.40 \leq x \leq 0.60$ in atomic proportion);

(c) the upper sublayer β has an average composition of $(Al_{1-y-z}Ti_yB_z)N$ (where y and z satisfy expressions: $0.40 \leq y \leq 0.60$ and $0.01 \leq z \leq 0.10$ in atomic proportion);

(d) the upper sublayer β has a compositionally variable profile in which the concentration of the B component varies repeatedly along the thickness of the upper sublayer;

(e) the variation in the concentration of the B component in the compositionally variable profile is repeated at an average interval of 1 to 100 nm between the maxima and the adjoining minima in the concentration of the B component;

(f) the average Bmaxav of the maxima in the concentration of the B component satisfies expression: $z<Bmaxav \leq 2.0 \times z$, and the average Bminav of the minima in the concentration of the B component satisfies expression: $0 \leq Bminav<z$;

(g) the average thickness of the hard coating layer is 1.0 to 4.0 μm, and the average thickness tα of the lower sublayer α and the average thickness tβ of the upper sublayer β satisfy expression: $2.0 \leq t\beta/t\alpha \leq 6.0$; and (h) the residual stress σ of the overall hard coating layer satisfies $-2.0 \text{ GPa} \leq \sigma \leq -0.5 \text{ GPa}$.

The surface-coated cutting tool of the above embodiment may satisfy one or more of the following conditions:

(1) The work ratio of plastic deformation Wplast/(Wplast+Welast) determined by a nanoindentation test on the upper sublayer β with an indentation depth of 1/10 or less of the layer thickness ranges from 0.42 to 0.47 and the nanoindentation hardness is 26 to 30 GPa; and (2) The hard coating layer further includes a topmost TiN sublayer.

Advantage of Invention

According to the above configuration, no abnormal damage, such as chipping, cracking, or flaking will occur, and excellent wear resistance will be ensured over a long period of use even when used for intermittent cutting of high-hardness steel.

EMBODIMENT OF INVENTION

Figure 1:
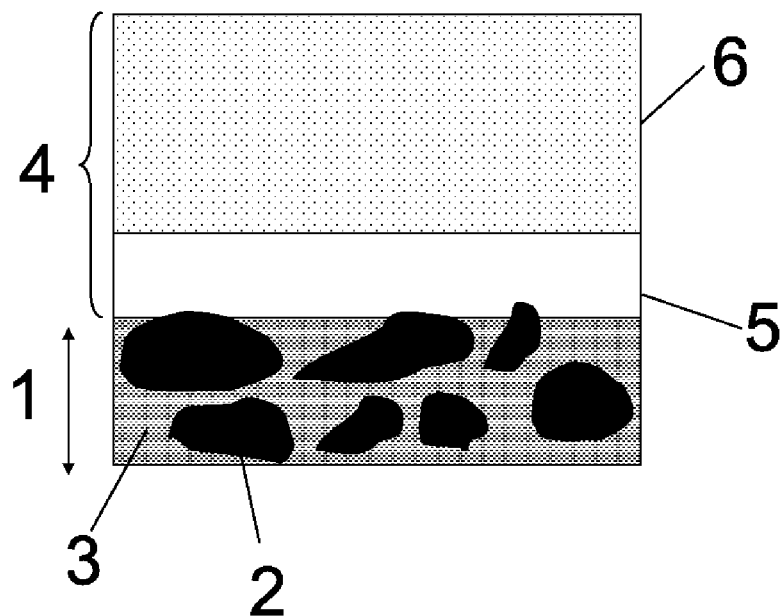
FIG. 1 is a cross-sectional schematic view of the layer configuration of the hard coating layer of the coated tool according to an embodiment of the present invention.

The inventors have made the following findings (1) through (4) as a result of their diligent study.

(1) A hard coating layer having a double-layer structure including a lower sublayer and an upper sublayer is vapor deposited at least on the surface of the cutting edge of a tool substrate composed of sintered cBN (hereinafter also referred to as "cBN substrate") where the lower sublayer is a composite nitride sublayer of Al and Ti (hereinafter also referred to as AlTiN) and functions as a buffer layer that exhibits excellent deformation followability. Such a lower sublayer enhances the adhesion strength between the tool substrate and the hard coating layer, and can reduce flaking of the hard coating layer on the cutting edge.

(2) The upper sublayer on the lower sublayer of the hard coating layer is composed of composite nitride of Al, Ti, and B (hereinafter also referred to as AlTiBN) and has a compositionally variable profile where the concentration of the B component repeatedly varies along the thickness of the sublayer (the cross section perpendicular to the surface of the tool substrate (the longitudinal cross section in the direction of the thickness of the hard coating layer)) imparts high hardness, high thermal conductivity, and high toughness to the cutting edge and thus can reduce the occurrence of chipping and cracking when the cutting edge is subjected to intermittent high loads.

(3) The hard coating layer having a predetermined amount of residual stress can prevent the propagation of interfacial cracks that occur at the interface between the lower sublayer and the cBN substrate and can also prevent propagation of cracks that occur on the surface of the upper sublayer into the upper sublayer during a cutting process, resulting in prevention of the occurrence of chipping and cracking even during the intermittent cutting of high-hardness steel.

(4) When the AlTiBN layer having a compositionally variable profile in which the concentration of B component varies repeatedly is vapor deposited with an arc ion plating system (AIP system), which is one of the physical vapor deposition systems, the DC bias voltage applied to the cBN substrate is controlled. The resulting hard coating layer has desirable residual stress.

The inventors speculate that the lower AlTiN sublayer has excellent strength and toughness due to the Ti component, improved high-temperature hardness and high thermal resistance due to the Al component, and improved high-temperature oxidation resistance due to coexistence of Al and Ti; that the upper AlTiBN sublayer, which is an AlTiN layer further containing an B component, has improved thermal conductivity; and that the AlTiBN layer has improved plastic deformation resistance and high-temperature hardness.

The embodiments of the present invention will now be described in detail.

Throughout the specification and the claims, the numerical range expressed as "A to B" (A and B are both numerals) includes the upper limit (B) and the lower limit (A), and the upper limit (B) and lower limit (A) has the same unit.

Hard Coating Layer:

With reference to FIG. 1, the hard coating layer according to the embodiment of the present invention has a lower AlTiN sublayer α on at least the cutting edge surface of the tool substrate and an upper AlTiBN sublayer β on the lower sublayer.

A topmost TiN sublayer may be disposed on the hard coating layer although not shown in FIG. 1. This TiN sublayer can serve, for example, as a corner identification layer, as described below.

The Ti component of the lower sublayer α ensures excellent strength and toughness, and the Al component improves high-temperature hardness and heat resistance. The coexistence of the Al and Ti components improves the high-temperature oxidation resistance and ensures excellent deformation followability. In addition, the lower sublayer α enhances the buffering effect between the upper sublayer β and the tool substrate and improves the adhesion strength of the hard coating layer, resulting in a reduction in flaking of the hard coating layer when the cutting edge is subjected to intermittent high loads.

The upper sublayer β, which further contains the B component in addition to the components of the lower sublayer α and has a compositionally variable profile having variable concentrations of the B component, exhibits high hardness and improved thermal conductivity. As a result, the upper sublayer β can keep high hardness and thus exhibits excellent wear resistance even by high heat during cutting, In particular, the compositionally variable profile in the upper sublayer β includes regions having a relatively low concentration of B component contributing to excellent strength and toughness (the concentration of B component on the side of minima Bmin) and regions having a relatively high concentration of B component contributing to high thermal conductivity and high hardness (the concentration of B component on the side of maxima Bmax) that are disposed repeatedly along the thickness of the upper sublayer β. Such a structure can reduce chipping and cracking of the hard coating layer during intermittent cutting processes where intermittent high loads are applied to the cutting edge.

In the hard coating layer, an average thickness of 1.0 to 4.0 μm that is the sum of the thickness of the lower sublayer α and the thickness of the upper sublayer β contributes to prominent advantageous effects described above, for the following reasons:

An average thickness of less than 1.0 μm causes the thickness of the hard coating layer to be small compared to the surface roughness of the tool substrate, and thus does not ensure sufficient wear resistance over a long period of use. An average thickness exceeding 4.0 μm causes coarsening of crystal grains of the composite nitride constituting the hard coating layer, resulting in ready occurrence of chipping and cracking.

Lower Sublayer α Constituting Hard Coating Layer:

The lower sublayer α preferably has a composition expressed by the formula: $(Al_{1-x}Ti_x)N$, where the average atomic proportion x of the Ti component to the total content of Al and Ti satisfies $0.40 \leq x \leq 0.60$ for the following reasons:

At a Ti proportion of less than 0.40, the AlTiN layer cannot maintain the rock salt type crystal structure, resulting in a significant decrease in hardness and a decrease in the deformation followability under a high load applied to the cutting edge. At a Ti proportion exceeding 0.60, the relative Al content decreases, resulting in insufficient high-temperature hardness and heat resistance.

Upper Sublayer β Constituting Hard Coating Layer:

The upper sublayer β further contains the B component in addition to the components of the lower sublayer α. The upper sublayer β has a compositionally variable profile in which the concentration of the B component varies repeatedly along the thickness of the layer.

The upper sublayer β preferably has a composition expressed by the formula: $(Al_{1-y-z}Ti_yB_z)N$, where the average atomic proportion y of the Ti content to the total content of Al and Ti is $0.40 \leq y \leq 0.60$, for the same reason as the proportion x of the Ti content in the lower sublayer α. However, the proportion y of the Ti content does not necessarily have to be the same value as (may differs from) the proportion x of the Ti content in the lower sublayer α.

An average atomic proportion z less than 0.01 of the B component to the total content of Al, Ti, and B in the upper sublayer β less contributes to improvements in hardness and thermal conductivity of the upper sublayer β. An average atomic proportion z exceeding 0.10 also less contributes to an improvement in hardness. It is accordingly preferred that the B content satisfies the relation: $0.01 \leq z \leq 0.10$.

The upper sublayer β has a compositionally variable profile in which the concentration of the B component preferably varies along the thickness of the layer.

In detail, layers with minima Bmin and layers with maxima Bmax in concentration are repeatedly disposed along the thickness of the upper sublayer.

Figure 2:
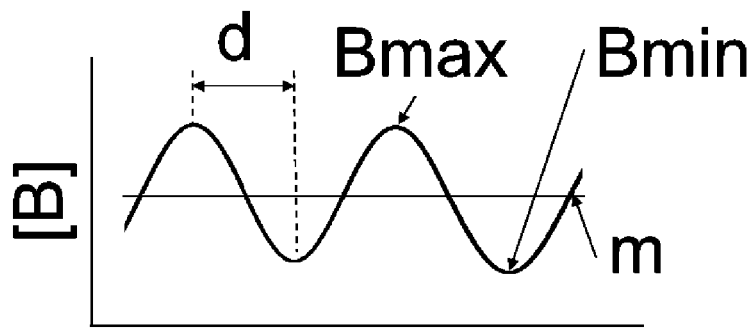
FIG. 2 is a schematic view illustrating the compositionally variable profile of the B component along the thickness of the upper sublayer β of the coated tool.

FIG. 2 schematically shows an example of the repeated variation in the concentration of the B component on the vertical axis and the position of the upper sublayer β on the horizontal axis. In FIG. 2, the maxima Bmax have the same value, minima Bmin also have the same value, and the intervals d between the adjacent maxima Bmax and minima Bmin are also the same. The maxima Bmax do not always have the same value, the minima Bmin do not always have the same value, and the intervals d between adjacent maxima Bmax and minima Bmin do not always have the same value, as long as the concentration of the B component has maxima Bmax and minima Bmin.

The average interval between the positions corresponding to the maxima Bmax and the adjoining positions corresponding to the minima Bmin in the upper sublayer β, which shows a repeated variation in concentration of the B component can be determined as follows: The B contents are measured in a direction perpendicular to the surface of the tool substrate (along the thickness) and plotted into a graph after removal of measurement noise by a known method in the cross-section (longitudinal section) of the upper sublayer β perpendicular to the surface of the tool substrate.

In detail, a straight line m is drawn across a curve that shows a repeated variation in concentration of the B component, as shown in FIG. 2. This line m is drawn such that the area of the upper regions surrounded by the curve and the straight line is equal to the area of the lower regions surrounded by the curve and the straight line. The maxima Bmax or minima Bmin of the concentration of the B component are then determined for each region divided by the straight line m of the curve, which shows the repeated variation in concentration of the B component. These observed values at several locations are averaged to determine the average interval of the repeated variation in concentration of the B component in the upper sublayer β. The value of the line m thus can correspond to the average proportion z of the B component.

In such a compositionally variable profile involving a variation in concentration of the B component, the upper sublayer β has excellent hardness and thermal conductivity in regions having relatively high concentrations of the B component (the concentration of B component on the side of maxima Bmax) and excellent strength and toughness in regions having relatively low concentrations of the B component (the concentration of B component on the side of minima Bmin); hence, the upper sublayer β has enhanced hardness, thermal conductivity, strength, and toughness as a whole. The occurrence of chipping and cracking can be reduced even when the cutting edge is subjected to intermittent high loads.

In the repeated variation in concentration of the B component in the compositionally variable profile, the intervals between the maxima Bmax and the adjoining minima Bmin in the concentration of the B component (distance along the thickness of the upper sublayer β should preferably be repeated with an average interval of 1 to 100 nm.

The reason for selection of this optimum range is as follows: An average interval less than 1 nm between the maxima Bmax and the minima in the concentration of the B component precludes distinct discrimination between the maxima Bmax and the minima Bmin in the upper sublayer β, resulting in unsatisfactory strength, toughness, and hardness of the layer. An average interval exceeding 100 nm between the maxima Bmax and the minima Bmin makes inherent disadvantages apparent in the maxima Bmax and the minima Bmin and thus impairs the advantages, such as reduced occurrence of chipping and cracking, of the upper sublayer β.

In order to reduce the occurrence of chipping and cracking, the average Bmaxav of the maxima Bmax and the average Bminav of the minima Bmin in the concentration of the B component preferably satisfy the relations: z<Bmaxav≤2.0×z and 0≤Bminav<z, respectively.

The average composition z of the upper sublayer β corresponds to the average of the maxima Bmax and the minima Bmin of the variable concentrations of the B component measured at five or more locations in the upper sublayer β, as described above.

In this embodiment, it has already been described that the average thickness of the hard coating layer is 1.0 to 4.0 μm. In addition, the ratio tβ/tα of the average thickness tβ of the upper sublayer β to the average thickness tα of the lower sublayer α more preferably satisfies the expression: 2.0≤tβ/tα≤6.0.

The reason for selection of this optimum ratio is as follows: A ratio tβ/tα in the range of 2 to 6 of the thickness can certainly reduce the occurrence of chipping and thus leads to excellent wear resistance.

The average compositions and average thicknesses of the lower sublayer α and the upper sublayer β, the average thickness of the hard coating layer, and the variation in concentration of the B component in the upper sublayer β were measured by secondary ion mass spectrometry (SIMS) in the depth direction of the hard coating layer (i.e., along the thickness of the hard coating layer) from the surface of the coated tool, and by scanning electron microscopy (SEM), transmission electron microscopy (TEM), and energy dispersive X-ray spectroscopy (EDS) of the longitudinal section perpendicular to the surface of the tool substrate.

Residual Stress σ of Overall Hard Coating Layer:

In this embodiment, in order to sufficiently prevent the propagation of cracks in the hard coating layer or the interface between the cBN substrate and the lower sublayer α, the overall hard coating layer preferably has a residual stress σ within the following range: −2.0 (GPa)≤σ≤−0.5 (GPa) where the symbol minus (−) means that the residual stress σ is a compressive residual stress). This measure reduces cracks that generated at the surface of the upper sublayer β propagate from and develop into the hard coating layer during cutting process, and prevents cracks from propagating and developing at the interface between the lower sublayer α and the cBN substrate, resulting in prevention of delamination of the hard coating layer.

The residual stress is determined, for example, by X-ray diffraction (XRD) using the well-known $2\theta-\sin^2\psi$ method. The principle and method of the measurement are described in detail in the Standard of X-ray Stress Measurement (1997 edition) published by Committee on X-ray Study of Mechanical Behavior of Materials in the Society of Materials Science, Japan; X-ray Stress Measurement Method (revised edition, Yokendo, 1990); and Fundamentals and Recent Development of X-ray Stress Measurement (Zairyo Vol. 47, No. 11, 1998).

The residual stress σ (GPa) of the overall hard coating layer is calculated from the peak intensity DI (indicated by a downward arrow in FIG. 3) that is a combination of the peak intensity of the lower sublayer α ((Ti,Al)N layer) and the upper sublayer β ((Ti,Al,B)N layer) in XRD.

Work Ratio of Plastic Deformation and Nanoindentation Hardness of Upper Sublayer β:

The work ratio of plastic deformation and the nanoindentation hardness of the upper sublayer β is determined by a nanoindentation test at an indentation depth of 1/10 or less of the thickness of the layer, and the work ratio of plastic deformation (=Wplast/(Wplast+Welast)) is preferably in the range of 0.42 to 0.47 and the nanoindentation hardness is preferably in the range of 26 GPa and 30 GPa.

The indentation depth should preferably be 1/10 or less of the thickness of the upper sublayer β and a typical load causing the indentation depth is 1.96 N (200 mgf).

The reason why a nanoindentation hardness in the above range is more desirable is that a nanoindentation hardness less than 26 GPa does not lead to sufficient wear resistance of the upper sublayer β while a nanoindentation hardness exceeding 30 GPa leads to ready chipping and cracking.

Figure 4:
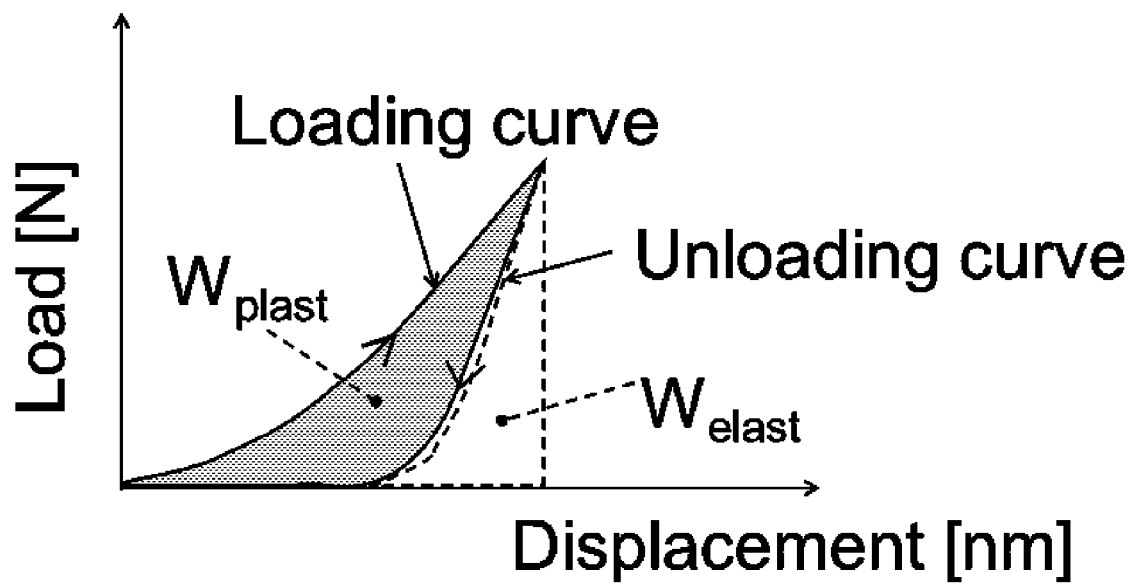
FIG. 4 is a schematic diagram of the loading curve and the unloading curve of load-versus-displacement for determining the work ratio of plastic deformation.
Figure 5:
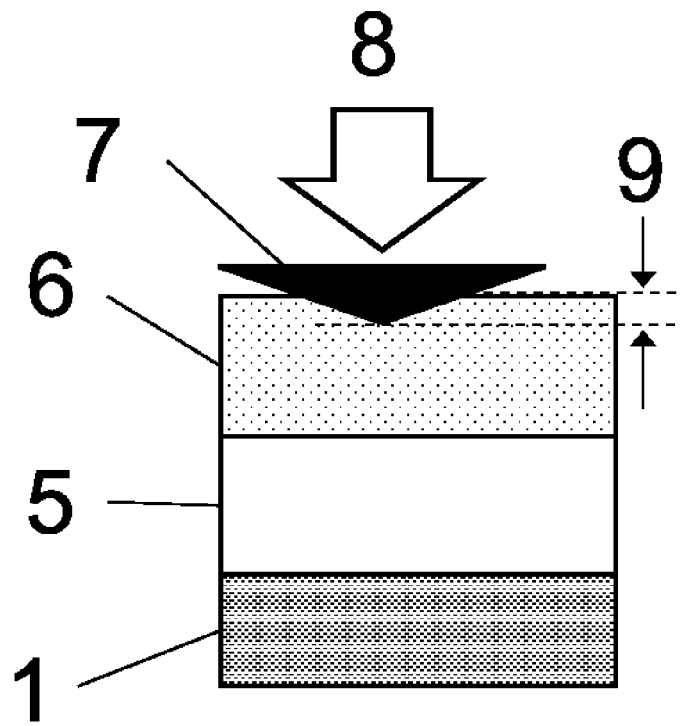
FIG. 5 is a schematic illustration of the testing method used to determine the work ratio of plastic deformation.

The work ratio of plastic deformation Wplast/(Wplast+Welast) is determined as follows: The surface of the upper sublayer β is loaded into an indentation depth of 1/10 or less of the thickness of the upper sublayer β (see FIG. 5) to determine a displacement-loading curve (see FIG. 4), and then unloaded to determine a displacement-unloading curve (see FIG. 4). The work of plastic deformation Wplast and the work of the elastic deformation Welast are determined from the difference between the loading and unloading curves. The work ratio of plastic deformation Wplast/(Wplast+Welast) is then calculated from these works.

The work ratio of plastic deformation Wplast/(Wplast+Welast) is more preferably in the range of 0.42 to 0.47.

The reason for selection of such a range is as follows: A work ratio of plastic deformation Wplast/(Wplast+Welast) of less than 0.42 may lead to insufficient impact relaxation properties, in detail, insufficient chipping resistance and fracture resistance. A value exceeding 0.47 may lead to a decrease in plastic deformation resistance and insufficient wear resistance.

The coated tool of this embodiment may further includes a topmost TiN layer on the upper sublayer β of the hard coating layer.

Since the topmost TiN layer, if provided, has a golden color tone, the topmost layer can be used as a discriminating layer to determine whether the cutting tool is unused or used, for example, by a change in color tone of the upper sublayer.

It is noted that the average thickness of the TiN layer as the discriminating layer may be, for example, 0.1 to 1 μm.

The cBN substrate, which is the substrate of the coated tools of the present invention may have any composition and any structure without limitation. The average size of cBN particles is in the range of 0.5 to 4.0 μm, and the volume ratio of cBN particles in the cBN sintered body should preferably be in the range of 40 to 70% by volume. In addition, the particles forming the binder phase in the cBN sintered body should preferably be composed of at least one selected from the group consisting of nitride, carbide, carbonitride, and boride of titanium (Ti), and nitride and oxide of aluminum (Al).

EXAMPLES

The present invention is described by way of the following examples, which should not be construed to limit the present invention.

Preparation of Tool Substrate:

cBN particles with an average size of 0.5 to 4.0 μm are prepared as a raw material for forming a hard phase, and TiN powder, TiC powder, TiCN powder, Al powder, AlN powder, and Al$_2$O$_3$ powder, each having an average particle size of 0.3 to 0.9 µm, were prepared as raw materials for forming a binder phase.

Some of the raw material powders for forming the binder phase were compounded with the cBN particles according to the formulation shown in Table 1 such that the content of the cBN particles in the cBN sintered body was 40 to 70% by volume. In Table 1, the symbol "-" indicates that the powder was not compounded.

The content (volume %) of the cBN particles in the cBN sintered body was determined by the following procedure: The cross-sectional texture of the cBN sintered body was observed by scanning electron microscopy (SEM) at a magnification of 5,000, and was subjected to analysis of the secondary electron image to extract portions of cBN particles. The area occupied by cBN particles was calculated by image analysis using image analysis software (ImageJ) and was divided by the total area of the image to calculate the area percent and the area percent was regarded as volume %. At least three areas were observed to determine volume percent of each area and to calculate the average volume % as a content (volume percent, vol %) of the cBN particles. The observation area used for image processing was 20 µm by 20 µm.

The compounded powder was wet-mixed in a ball mill for 72 hours, dried, and pressed with a hydraulic press at a compaction pressure of 1 MPa to obtain a green compact with dimensions of 50 mm in diameter and 1.5 mm in thickness. The green compact was then presintered at 900 to 1300° C. under a vacuum pressure of less than 1×10$^{-4}$ Pa. The calcined product was then sintered under a pressure of 5 GPa at a temperature of 1200 to 1,400° C. for 30 minutes to produce a cBN sintered body.

The cBN sintered body was cut with a wire electric discharge machine into predetermined dimensions. An insert body composed of Co: 5 mass %, TaC: 5 mass %, and WC: the balance and having a shape in accordance with ISO standard CNGA 120408 was prepared. The cut sintered body was brazed with an Ag-based brazing material (Cu: 26%, Ti: 5%, Ag: balance) to a brazed portion (corner) of the insert body. The top and bottom surfaces and the outer circumference are polished and honed to prepare cBN substrates 1 to 3 with an insert shape specified in the ISO standard CNGA120408 for examples.

TABLE 1

| Type of cBN | Composition (volume %) | | | | | | |
| --- | --- | --- | --- | --- | --- | --- | --- |
| substrate | TiN | TiC | TiCN | Al | AlN | Al$_2$O$_3$ | cBN |
| Substrate 1 | — | — | 25 | 32 | — | 3 | 40 |
| Substrate 2 | — | 20 | — | 23 | 2 | — | 55 |
| Substrate 3 | 18 | — | — | 11 | 1 | — | 70 |

Figure 6:
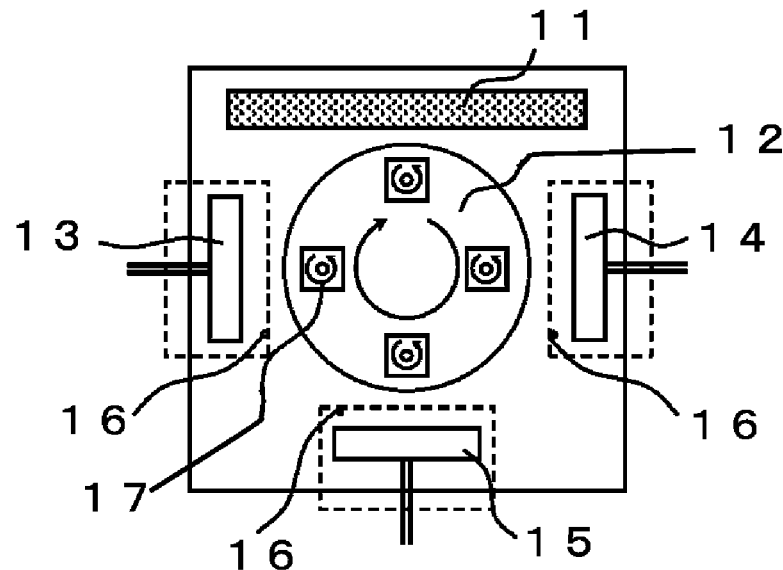
FIG. 6 is a schematic plan view of the arc ion plating (AIP) system for depositing the hard coating layer of the coated tool according to an embodiment of the present invention.
Figure 7:
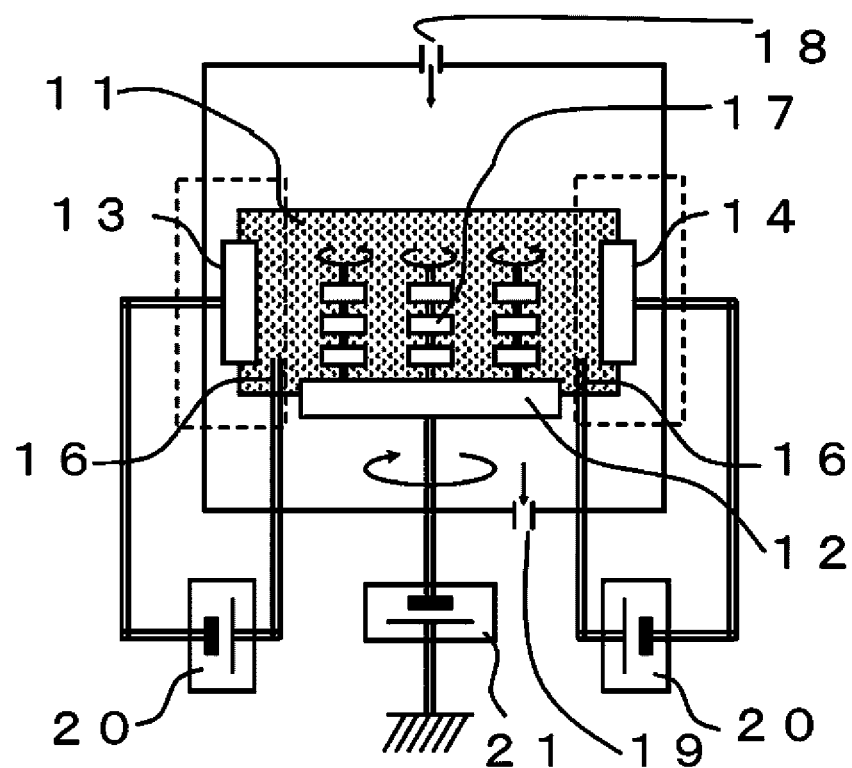
FIG. 7 is a schematic side view of the arc ion plating (AIP) system shown in FIG. 6.

Deposition Process:

Hard coating layers are formed on the cBN substrates (tool substrates) 1 to 3 by the following process using an arc ion plating system shown in FIGS. 6 and 7 to prepare coated tools (also referred to as examples) 1 to 10 of inventive examples.

(a) The cBN substrates 1 to 3 were ultrasonically cleaned in acetone, dried, and mounted along the periphery at a predetermined interval in the radial direction from the central axis on a turntable in an arc ion plating device. Cathode (evaporation sources) composed of an Al—Ti alloy with a predetermined composition for forming the lower sublayer α, an Al—Ti—B alloy for forming the upper sublayer β, and an Al—Ti alloy for forming the upper sublayer β were placed at predetermined positions in the system.

In the case that the Ti proportion x in the lower sublayer α is the same as the Ti proportion y in the upper sublayer β, a single Al—Ti alloy may be used for forming the lower sublayer α and for forming the upper sublayer β, although this measure was not employed in Examples 1 to 3.

(b) While being evacuated to maintain the vacuum at less than 10$^{-2}$ Pa, the system was heated to 500° C. by a heater. The atmosphere of the system was then replaced with Ar gas of 2 Pa, and a DC bias voltage of −200 to −600 V was applied to the cBN substrates 1 to 3 that were rotating while revolving on the turntable to subject the surfaces of the substrates to bombard cleaning by argon ions.

(c) Nitrogen reaction gas was introduced into the system and the system was maintained at an atmospheric temperature of deposition of 400 to 550° C. and a nitrogen gas pressure within a range of 2 to 8 Pa as shown in Table 2. A DC bias voltage of −20 to −100 V as shown in Table 2 was applied to the cBN substrates 1 to 3 rotating while revolving on the turntable, and a predetermined current within a range of 100 to 200 A was supplied between a cathode (evaporation source) composed of an Al—Ti alloy and an anode as shown in Table 2 to generate arc discharge. A lower sublayer α composed of (Al,Ti)N with an average composition and an average thickness as shown in Table 2 was thereby deposited on the surface of each of the cBN substrates 1 to 3.

(d) Nitrogen reaction gas was introduced into the system and the system was maintained at an atmospheric temperature of deposition to 400-550° C. and a nitrogen gas pressure within a range of 3 to 10 Pa as shown in Table 3. A DC bias voltage of −30 to −100 V as shown in Table 3 was applied to the cBN substrates 1 to 3 orbiting while spinning on the turntable, and a predetermined current of within a range of 90 to 180 A as shown in Table 3 was applied between a cathode composed of an Al—Ti—B alloy (evaporation source) and an anode as shown in Table 3 to generate arc discharge. At the same time, a predetermined DC bias voltage of −30 to −100 V as shown in Table 3 was applied, and a predetermined current of 90 to 180 A as shown in Table 3 was applied between the cathode (evaporation source) composed of an Al—Ti alloy and the anode, to generate arc discharge for co-deposition, to thereby form an upper (Al,Ti,B)N sublayer β that has an average composition and thickness shown in Table 3 and has a compositionally variable profile in the upper (Al,Ti,B)N sublayer.

The details of the lower sublayers α and upper sublayers β are shown in Table 6.

The maxima Bmax and the minima Bmin in concentration of the B component and the average interval between the adjacent maxima Bmax and minima Bmin in the upper sublayer β can be controlled by the rotation speed of turntable, on which the cBN substrate is mounted, the B content in the Al—Ti—B alloy, and the intensity of the arc discharge between the cathode composed of the Al—Ti—B alloy and the anode, in process (d). The residual stress σ of the overall hard coating layer can be controlled through adjustment of the bias voltage.

In process (c), deposition was performed at a lower gas pressure and higher arc current than in process (d), such that the lower sublayer α had a fine texture. In contrast, in process (d), deposition was performed at a higher gas pressure and lower arc current than in process (c), such that the upper sublayer β was thicker than the lower sublayer α through adjustment of the deposition time.

For comparison, the conditions in processes (c) and (d) were modified to values shown in Table 4 and Table 5 for deposition on the cBN substrates 1 to 3, to produce comparative example coated tools (also called comparative examples) 1 to 6 each having a composition, a ratio of the thickness of the upper sublayer β to the thickness of the lower sublayer α, and a residual stress σ that are shown in Table 7.

For some of the inventive examples and comparative examples, a cathode (evaporation source) composed of metal Ti (not shown in FIGS. 6 and 7) was installed in the system, and an upper sublayer composed of TiN with a thickness of 0.1 to 1 μm was further deposited as an uppermost layer of the hard coating layer.

For Examples 1 to 10 and Comparative Examples 1 to 6, the compositions of the lower sublayer α and the upper sublayer β, and the maxima Bmax and minima Bmin in the concentrations of the B component in the compositionally variable profile of the upper sublayer β were measured at five or more locations by secondary ion mass spectrometry (SIMS), and these observed values were averaged to determine x y, z, Bmaxav, and Bminav The average content z of the B component in the upper sublayer β having a compositionally variable profile was determined as the average of values (Bmax+Bmin)/2 measured at five or more locations.

For the thicknesses of the lower sublayer α and the upper sublayer β, the longitudinal section was observed with a scanning electron microscope (SEM) to measure the thicknesses in the direction perpendicular to the surface of the cBN substrate at any five points in the field of view, to calculate the average thickness from the observed values, and to determine the ratio tβ/tα of the upper sublayer β to the lower sublayer α.

The intervals between points having maxima Bmax and adjoining points having minima Bmin in the concentration of the B component were measured at five or more locations where the maxima Bmax and adjoining minima Bmin in the concentration of the B component were detected, and these intervals were averaged to determine the average intervals between the maxima Bmax and minima Bmin in the concentration of the B component.

The residual stress σ (GPa) of the overall hard coating layer was measured for Examples 1 to 10 and Comparative Examples 1 to 6 fabricated as described above.

The residual stress σ (GPa) was measured on the cemented carbide of the flank surface. Since the cutting edge of cBN-coated tool is brazed to the brazed part (corner) of the insert body made of WC-based cemented carbide, the residual stress of the coating on the cutting edge used for cutting is equivalent to the residual stress measured as described herein.

Figure 3:
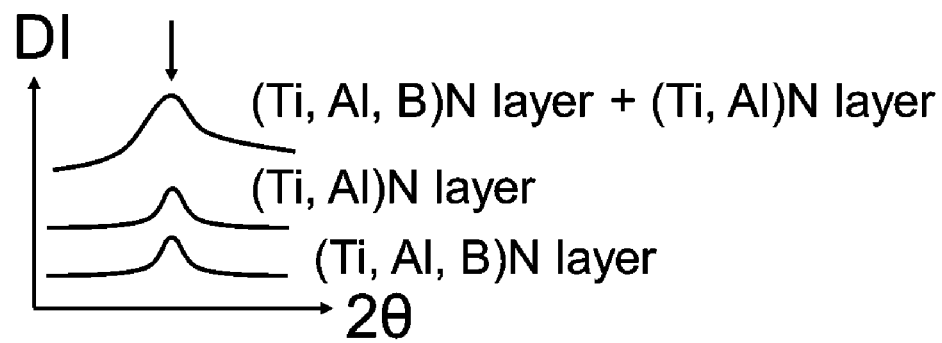
FIG. 3 is a schematic view for measuring the residual stress σ of the overall hard coating layer.

In other words, the residual stress σ (GPa) of the overall hard coating layer was calculated by evaluating the overlapping XRD peaks of the lower sublayer α and upper sublayer β as shown in FIG. 3 as a single peak, as described above.

The upper sublayer β of Examples 1 to 6 and Comparative Examples 1 to 6 were subjected to nanoindentation tests where the work ratio of plastic deformation and hardness were measured at five or more locations as described above, and the average of the measured values was taken as a nanoindentation hardness.

Tables 2 to 7 show the results of the measurement and calculation.

TABLE 2

| Type | | cBN Substrate | Deposition condition of lower sublayer α | | | | | Composition of lower sublayer α $(Al_{1-x}Ti_x)N$ | | 
|---|---|---|---|---|---|---|---|---|---|
| | | | Rotation speed of turntable (rpm) | Deposition temp. (°C.) | Nitrogen gas pressure (Pa) | Bias voltage (V) | Arc current (A) | x | Average thickness tα (μm) |
| Inventive Example | 1 | Substrate 1 | 2.0 | 450 | 8 | −40 | 120 | 0.55 | 0.4 |
| | 2 | Substrate 2 | 2.0 | 400 | 7 | −40 | 150 | 0.50 | 0.6 |
| | 3 | Substrate 3 | 3.0 | 500 | 6 | −50 | 110 | 0.60 | 0.3 |
| | 4 | Substrate 1 | 2.0 | 500 | 6 | −80 | 180 | 0.40 | 0.7 |
| | 5 | Substrate 2 | 3.0 | 550 | 8 | −100 | 200 | 0.50 | 0.6 |
| | 6 | Substrate 3 | 2.0 | 400 | 4 | −55 | 120 | 0.50 | 0.8 |
| | 7 | Substrate 1 | 2.0 | 450 | 4 | −20 | 100 | 0.55 | 0.4 |
| | 8 | Substrate 2 | 2.0 | 500 | 2 | −40 | 150 | 0.50 | 0.2 |
| | 9 | Substrate 3 | 2.0 | 500 | 5 | −40 | 150 | 0.60 | 0.4 |
| | 10 | Substrate 1 | 2.0 | 450 | 4 | −50 | 120 | 0.60 | 0.4 |

TABLE 3

| Type | | cBN Substrate | Deposition condition of upper sublayer β | | | | | Composition of upper sublayer β $(Al_{1-y-z}Ti_yB_z)N$ | | |
|---|---|---|---|---|---|---|---|---|---|---|
| | | | Rotation speed of turntable (rpm) | Deposition temp. (°C.) | Nitrogen gas pressure (Pa) | Bias voltage (V) | Arc current (A) | y | z | Average thickness tβ (μm) |
| Inventive Example | 1 | Substrate 1 | 2.0 | 450 | 9 | −50 | 110 | 0.50 | 0.01 | 2.1 |
| | 2 | Substrate 2 | 1.5 | 400 | 8 | −40 | 120 | 0.50 | 0.10 | 2.6 |

TABLE 3-continued

| Type | | cBN Substrate | Deposition condition of upper sublayer β | | | | | Composition of upper sublayer β $(Al_{1-y-z}Ti_yB_z)N$ | | |
|---|---|---|---|---|---|---|---|---|---|---|
| | | | Rotation speed of turntable (rpm) | Deposition temp. (° C.) | Nitrogen gas pressure (Pa) | Bias voltage (V) | Arc current (A) | y | z | Average thickness tβ (μm) |
| | 3 | Substrate 3 | 3.0 | 500 | 8 | −40 | 100 | 0.40 | 0.04 | 0.7 |
| | 4 | Substrate 1 | 2.0 | 500 | 8 | −80 | 150 | 0.50 | 0.06 | 1.4 |
| | 5 | Substrate 2 | 3.0 | 550 | 10 | −100 | 180 | 0.50 | 0.02 | 3.2 |
| | 6 | Substrate 3 | 2.0 | 400 | 6 | −60 | 100 | 0.60 | 0.08 | 3.2 |
| | 7 | Substrate 1 | 2.0 | 450 | 6 | −30 | 90 | 0.50 | 0.03 | 1.8 |
| | 8 | Substrate 2 | 1.5 | 500 | 3 | −40 | 120 | 0.50 | 0.04 | 0.8 |
| | 9 | Substrate 3 | 2.0 | 500 | 7 | −50 | 120 | 0.55 | 0.05 | 1.1 |
| | 10 | Substrate 1 | 2.0 | 450 | 6 | −40 | 100 | 0.45 | 0.06 | 2.4 |

TABLE 4

| Type | | cBN Substrate | Deposition condition of lower sublayer α | | | | | Composition of lower sublayer α $(Al_{1-x}Ti_x)N$ | |
|---|---|---|---|---|---|---|---|---|---|
| | | | Rotation speed of turntable (rpm) | Deposition temp. (° C.) | Nitrogen gas pressure (Pa) | Bias voltage (V) | Arc current (A) | x | Average thickness tα (μm) |
| Comparative Example | 1 | Substrate 1 | 2.0 | 450 | 4 | −120 | 120 | 0.45 | 0.4 |
| | 2 | Substrate 2 | 2.5 | 500 | 5 | −20 | 150 | 0.50 | 0.4 |
| | 3 | Substrate 3 | 2.0 | 450 | 4 | −40 | 120 | 0.45 | 0.6 |
| | 4 | Substrate 1 | 2.5 | 500 | 3 | −80 | 110 | 0.50 | 0.4 |
| | 5 | Substrate 2 | 3.0 | 550 | 5 | −40 | 150 | 0.40 | 0.5 |
| | 6 | Substrate 3 | 2.0 | 500 | 4 | −110 | 110 | 0.60 | 0.3 |

TABLE 5

| Type | | cBN Substrate | Deposition condition of upper sublayer β | | | | | Composition of upper sublayer β $(Al_{1-y-z}Ti_yB_z)N$ | | |
|---|---|---|---|---|---|---|---|---|---|---|
| | | | Rotation speed of turntable (rpm) | Deposition temp. (° C.) | Nitrogen gas pressure (Pa) | Bias voltage (V) | Arc current (A) | y | z | Average thickness tβ (μm) |
| Comparative Example | 1 | Substrate 1 | 2.0 | 450 | 4 | −120 | 100 | 0.35 | 0.05 | 2.1 |
| | 2 | Substrate 2 | 2.5 | 500 | 3 | −20 | 120 | 0.50 | 0.08 | 2.6 |
| | 3 | Substrate 3 | 2.0 | 450 | 5 | −50 | 150 | 0.35 | 0.05 | 4.4 |
| | 4 | Substrate 1 | 2.5 | 500 | 4 | −40 | 120 | 0.60 | 0.12 | 1.6 |
| | 5 | Substrate 2 | 3.0 | 550 | 3 | −40 | 150 | 0.50 | 0.15 | 2.5 |
| | 6 | Substrate 3 | 2.0 | 500 | 5 | −120 | 100 | 0.45 | 0.02 | 2.7 |

TABLE 6

| Type | cBN Substrate | Average thickness of hard coating layer (μm) | Average ratio (tβ/tα) of thickness of lower layer α to upper layer β | Variation in concentration of B component in upper sublayer β | | | |
|---|---|---|---|---|---|---|---|
| | | | | Average Bmaxav of maxima Bmax of concentrations of B component (atomic proportion) | (Ref.) Average atomic proportion z × 2.0 of B component | (Ref.) Average atomic proportion z of B component | Average Bminav of minima Bmin of concentrations of B component (atomic proportion) |

TABLE 6-continued

| | | | | | | | |
|---|---|---|---|---|---|---|---|
| Inventive example | 1 | Substrate 1 | 2.5 | 5.3 | 0.02 | 0.02 | 0.01 | 0.00 |
| | 2 | Substrate 2 | 3.2 | 4.3 | 0.18 | 0.20 | 0.10 | 0.02 |
| | 3 | Substrate 3 | 1.0 | 2.3 | 0.07 | 0.08 | 0.04 | 0.01 |
| | 4 | Substrate 1 | 2.1 | 2.0 | 0.12 | 0.12 | 0.06 | 0.00 |
| | 5 | Substrate 2 | 3.8 | 5.3 | 0.04 | 0.04 | 0.02 | 0.00 |
| | 6 | Substrate 3 | 4.0 | 4.0 | 0.14 | 0.16 | 0.08 | 0.02 |
| | 7 | Substrate 1 | 2.2 | 4.5 | 0.06 | 0.06 | 0.03 | 0.00 |
| | 8 | Substrate 2 | 1.0 | 4.0 | 0.08 | 0.08 | 0.04 | 0.00 |
| | 9 | Substrate 3 | 1.5 | 2.8 | 0.09 | 0.10 | 0.05 | 0.01 |
| | 10 | Substrate 1 | 2.8 | 6.0 | 0.11 | 0.12 | 0.06 | 0.01 |

| Type | | Variation in concentration of B component in upper sublayer β Average interval between maxima Bmax and minima Bmin (nm) | Residual stress of overall hard coating layer (Gpa) | Nanoindentation test | | Upper sublayer | |
|---|---|---|---|---|---|---|---|
| | | | | Work ratio of plastic deformation | Nanoindentation hardness (Gpa) | TiN layer | Average thickness of TiN layer (μm) |
| Inventive example | 1 | 25 | −0.8 | 0.45 | 28 | Formed | 0.20 |
| | 2 | 35 | −0.5 | 0.44 | 28 | Formed | 0.50 |
| | 3 | 8 | −0.9 | 0.46 | 26 | None | — |
| | 4 | 32 | −1.2 | 0.44 | 29 | Formed | 0.20 |
| | 5 | 85 | −2.0 | 0.43 | 28 | Formed | 0.10 |
| | 6 | 45 | −1.5 | 0.43 | 30 | None | — |
| | 7 | 32 | −0.9 | 0.45 | 29 | None | — |
| | 8 | 100 | −1.0 | 0.44 | 28 | Formed | 1.00 |
| | 9 | 45 | −1.4 | 0.42 | 29 | None | — |
| | 10 | 24 | −1.2 | 0.48 | 27 | Formed | 0.80 |

TABLE 7

| Type | | cBN Substrate | Average thickness of hard coating layer (μm) | Average ratio ($t\beta/t\alpha$) of thickness of lower layer α to upper layer β | Variation in concentration of B component in upper sublayer β | | | |
|---|---|---|---|---|---|---|---|---|
| | | | | | Average Bmaxav of maxima Bmax of concentrations of B component (atomic proportion) | (Ref.) Average atomic proportion z × 2.0 of B component | (Ref.) Average atomic proportion z of B component | Average Bminav of minima Bmin of concentrations of B component (atomic proportion) |
| Comparative Example | 1 | Substrate 1 | 2.5 | 5.3 | 0.10 | 0.10 | 0.05 | 0.00 |
| | 2 | Substrate 2 | 3.0 | 6.5 | 0.14 | 0.16 | 0.08 | 0.02 |
| | 3 | Substrate 3 | 5.0 | 7.3 | 0.09 | 0.10 | 0.05 | 0.01 |
| | 4 | Substrate 1 | 2.0 | 4.0 | 0.22 | 0.24 | 0.12 | 0.02 |
| | 5 | Substrate 2 | 3.0 | 5.0 | 0.29 | 0.30 | 0.15 | 0.01 |
| | 6 | Substrate 3 | 3.0 | 9.0 | 0.03 | 0.04 | 0.02 | 0.01 |

| Type | | Variation in concentration of B component in upper sublayer β Average interval between maxima Bmax and minima Bmin (nm) | Residual stress of overall hard coating layer (Gpa) | Nanoindentation test | | Upper sublayer | |
|---|---|---|---|---|---|---|---|
| | | | | Work ratio of plastic deformation | Nanoindentation hardness (Gpa) | TiN layer | Average thickness of TiN layer (μm) |
| Comparative Example | 1 | 30 | −3.0 | 0.41 | 32 | Formed | 0.10 |
| | 2 | 42 | −0.3 | 0.47 | 26 | None | — |
| | 3 | 15 | −1.0 | 0.44 | 28 | Formed | 0.50 |
| | 4 | 22 | −1.0 | 0.48 | 25 | Formed | 0.20 |
| | 5 | 15 | −1.0 | 0.42 | 25 | None | — |
| | 6 | 25 | −2.5 | 0.43 | 28 | Formed | 0.20 |

Examples 1 to 10 and Comparative Examples 1 to 6 were then each subjected to observation of chipping and cracking and determination of the wear on the flank of the cutting edge every 100 m of cutting length in a maximum cutting length of 1200 m under the following dry intermittent cutting conditions:

Cutting Conditions

Work material: Round bar with four longitudinal grooves evenly spaced along the length made of carburized and quenched (HRC60) chromium steel (JIS SCr420), Cutting speed: 120 m/min.
Depth of cut: 0.2 mm
Feed: 0.15 mm/rev The chipping, fracturing, and flaking were evaluated through SEM observation of the cutting edge surface of the coated tool.

Table 8 shows the results.

The service life was determined when the wear on the flank surface reached 0.25 mm before the maximum cutting length was achieved, or when chipping, fracturing, or flaking of the cutting edge occurred.

TABLE 8

| | | Results of cutting test | |
|---|---|---|---|
| Type | | Wear of flank face (mm) | Chipping, fracturing, or flaking |
| Inventive Example | 1 | 0.08 | None |
| | 2 | 0.11 | None |
| | 3 | 0.14 | None |
| | 4 | 0.07 | None |
| | 5 | 0.08 | None |
| | 6 | 0.05 | None |
| | 7 | 0.09 | None |
| | 8 | 0.08 | None |
| | 9 | 0.04 | None |
| | 10 | 0.12 | None |
| Comparative Example | 1 | *300 | Observed |
| | 2 | *360 | Observed |
| | 3 | *540 | Observed |
| | 4 | *420 | Observed |
| | 5 | *300 | Observed |
| | 6 | *240 | Observed |

In Table 8, the symbol "*" indicates the time (in seconds) to reach the end of service life before the maximum cutting length.

The results shown in Table 8 demonstrate that each inventive example has average compositions of the lower sublayer α and upper sublayer β within predetermined ranges on the surface of the cBN substrate, a compositionally variable profile of the B component in the upper sublayer β, a predetermined range of ratio of the thicknesses of the upper sublayer β to the lower sublayer α, and a predetermined range of residual stress σ (GPa) of the overall hard coating layer, and demonstrates that the inventive examples exhibit excellent wear resistance over a long period of use without chipping, fracturing, or flaking, even when the hard coating layer is used for intermittent cutting of high-hardness steel, which is subjected to intermittent and impactful high loads on the cutting edge.

In contrast, the comparative examples are all prone to chipping, fracturing, and flaking, and also have poor wear resistance, reaching the end of their service life in a relatively short time.

The embodiments disclosed above are for illustrative only and not limiting. The scope of the invention is indicated by the claims, not the embodiments, and is intended to include all modifications and equivalents within the meaning and scope of the claims.

REFERENCE SIGNS LIST 1 tool substrate (cBN substrate)
2 cBN particles
3 binder phase
4 hard coating layer
5 lower sublayer α
6 upper sublayer β
7 indenter
8 load
9 displacement
11 heater
12 turntable
13 Al—Ti alloy target (evaporation source) for formation of upper sublayer β
14 Ai-Ti—B alloy target (evaporation source)
15 Ai-Ti alloy target (evaporation source) for forming lower sublayer α
16 anode
17 tool substrate (cBN substrate)
18 reaction gas inlet
19 exhaust gas port
20 arc power supply
21 bias power supply

The invention claimed is:

1. A surface-coated cutting tool comprising:
   a tool substrate comprising a cubic boron nitride sinter and having a cutting edge; and
   a hard coating layer on at least the surface of the cutting edge; wherein
   (a) the hard coating layer includes a lower sublayer α directly on the tool substrate and an upper sublayer β on the lower sublayer α;
   (b) the lower sublayer α has an average composition of $(Al_{1-x}Ti_x)N$ (where x satisfies expression: $0.40 \leq x \leq 0.60$ in atomic proportion);
   (c) the upper sublayer β has an average composition of $(Al_{1-y-z}Ti_yB_z)N$ (where y and z satisfy expressions: $0.40 \leq y \leq 0.60$ and $0.01 \leq z \leq 0.10$ in atomic proportion);
   (d) the upper sublayer β has a compositionally variable profile in which the concentration of the B component varies repeatedly along the thickness of the upper sublayer;
   (e) the variation in the concentration of the B component in the compositionally variable profile is repeated at an average interval of 1 to 100 nm between the maxima and the adjoining minima in the concentration of the B component;
   (f) the average Bmaxav of the maxima in the concentration of the B component satisfies expression: $z < Bmaxav \leq 2.0 \times z$, and
   the average Bminav of the minima in the concentration of the B component satisfies expression: $0 \leq Bminav < z$;
   (g) the average thickness of the hard coating layer is 1.0 to 4.0 μm, and the average thickness tα of the lower sublayer α and the average thickness tβ of the upper sublayer β satisfy expression: $2.0 \leq t\beta/t\alpha \leq 6.0$; and
   (h) the residual stress σ of the overall hard coating layer satisfies $-2.0 \text{ GPa} \leq \sigma \leq -0.5 \text{ GPa}$.

2. The surface-coated cutting tool set forth in claim 1, wherein
   the work ratio of plastic deformation Wplast/(Wplast+Welast) determined by a nanoindentation test on the upper sublayer β with an indentation depth of 1/10 or less of the layer thickness ranges from 0.42 to 0.47 and the nanoindentation hardness is 26 to 30 GPa.

3. The surface-coated cutting tool set forth in claim 1, wherein
   the hard coating layer further includes a topmost TiN sublayer.

4. The surface-coated cutting tool set forth in claim 2, wherein
the hard coating layer further includes a topmost TiN sublayer.

* * * * *